United States Patent
Ishikawa et al.

(10) Patent No.: US 10,866,509 B2
(45) Date of Patent: Dec. 15, 2020

(54) MOLD, IMPRINT DEVICE, AND IMPRINT METHOD

(71) Applicant: Panasonic Intellectual Property Management Co., Ltd., Osaka (JP)

(72) Inventors: Akihiro Ishikawa, Osaka (JP); Tosihiko Wada, Osaka (JP); Teppei Iwase, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 253 days.

(21) Appl. No.: 15/768,030

(22) PCT Filed: Jun. 9, 2017

(86) PCT No.: PCT/JP2017/021408
§ 371 (c)(1),
(2) Date: Apr. 13, 2018

(87) PCT Pub. No.: WO2018/008326
PCT Pub. Date: Jan. 11, 2018

(65) Prior Publication Data
US 2018/0321584 A1    Nov. 8, 2018

(30) Foreign Application Priority Data

Jul. 5, 2016    (JP) .................... 2016-132985

(51) Int. Cl.
*G03F 7/00* (2006.01)
*B29C 35/08* (2006.01)
(Continued)

(52) U.S. Cl.
CPC ............ *G03F 7/0002* (2013.01); *B29C 33/40* (2013.01); *B29C 33/424* (2013.01);
(Continued)

(58) Field of Classification Search
None
See application file for complete search history.

(56) References Cited

U.S. PATENT DOCUMENTS

2009/0273119 A1* 11/2009 Imai ................. G11B 5/743
264/293
2012/0168065 A1* 7/2012 Kaida ............... G02B 5/3058
156/246
(Continued)

FOREIGN PATENT DOCUMENTS

| JP | 2011-204309 | 10/2011 |
| JP | 2014-054735 | 3/2014 |
| JP | 2016-082204 | 5/2016 |

OTHER PUBLICATIONS

International Search Report of PCT application No. PCT/JP2017/021408 dated Sep. 12, 2017.

*Primary Examiner* — Matthew J Daniels
*Assistant Examiner* — Paul Spiel
(74) *Attorney, Agent, or Firm* — Wenderoth, Lind & Ponack, L.L.P.

(57) ABSTRACT

A mold includes a rugged pattern layer, an inorganic sheet layer, and an elastic sheet layer. The inorganic sheet layer is formed of an inorganic material and supports the rugged pattern layer. The elastic sheet layer supports the inorganic sheet layer.

17 Claims, 4 Drawing Sheets

(51) Int. Cl.
  *B29C 33/42*  (2006.01)
  *B29C 59/02*  (2006.01)
  *B29C 33/40*  (2006.01)
  *B29C 59/04*  (2006.01)

(52) U.S. Cl.
  CPC ........ *B29C 35/0888* (2013.01); *B29C 59/026* (2013.01); *B29C 59/046* (2013.01); *B29C 2035/0827* (2013.01); *B29C 2059/023* (2013.01); *B29K 2995/0094* (2013.01)

(56) References Cited

U.S. PATENT DOCUMENTS

2012/0321738 A1* 12/2012 Ishii ................. B82Y 10/00
                                               425/385
2016/0299424 A1* 10/2016 Chouiki ............. G03F 7/0002
2017/0205708 A1*  7/2017 Miyazawa .......... G03F 7/0002

* cited by examiner

MOLD, IMPRINT DEVICE, AND IMPRINT METHOD

This application is a U.S. national stage application of the PCT International Application No. PCT/JP2017/021408 filed on Jun. 9, 2017, which claims the benefit of foreign priority of Japanese patent application 2016-132985 filed on Jul. 5, 2016, the contents all of which are incorporated herein by reference.

BACKGROUND

Technical Field

The present disclosure relates to a mold, an imprint device, and an imprint method.

Description of the Related Art

In recent years, in an optical component used for products such as display or illuminations, it is required to form a fine pattern in a range from a nanometer (nm) order to a micrometer (μm) order. The formed fine pattern exhibits specific optical characteristics such as light reflection and diffraction control. As a method of forming a fine pattern, photolithography technology, electron beam lithography technology, and the like are known. Among these methods, an imprint technology is attracted attention.

The imprint technology is a method of forming a fine pattern by pressing a mold having a surface to which a fine pattern is imparted against resin applied to a surface of a base material which is an optical component.

As an imprint method, a heat imprint method and an ultraviolet (UV) imprint method are known as a broad classification. The heat imprint method is a method of transferring a fine pattern of a mold to thermoplastic resin by pressing a mold heated to a temperature higher than a glass transition temperature against thermoplastic resin applied to a surface of a board. The UV imprint method is a method of transferring a fine pattern to ultraviolet (UV) curable resin by irradiating the UV curable resin with UV light in a state in which a mold imparted with a fine pattern is pressed against the UV curable resin. The heat imprint method has a feature that a transfer material can be selected in a wide range. However, since it is required to raise and lower the temperature of a mold at a time of transferring a fine pattern, the heat imprint method has a disadvantage of low throughput. On the other hand, since a transfer material used in the UV imprint method is limited to a transfer material that is cured with ultraviolet rays, the transfer material can be selected in a narrower range comparing to the heat imprint method; however, it is possible to complete curing within several seconds to several tens of seconds. That is, the UV imprint method has a feature of very high throughput. Depending on a device to be produced, it varies which of the heat imprint method and the UV imprint method is adopted. In a case where there is no problem due to a material, it is considered that the UV imprint method is appropriate as a mass production method.

The UV imprint method according to the related art will be described here. A UV imprint method disclosed in Japanese Patent Unexamined Publication No. 2014-54735 (PTL 1) is carried out by pressing a sheet-shaped mold with a formed fine pattern to UV curable resin applied to a surface of a board in advance, using a pressure roll. The UV curable resin is cured by irradiating a vicinity of a contact portion between the pressure roll and the board with UV light.

SUMMARY

A mold of the present disclosure includes a rugged pattern layer, an inorganic sheet layer, and an elastic sheet layer. The inorganic sheet layer is formed of an inorganic material and supports the rugged pattern layer. The elastic sheet layer supports the inorganic sheet layer.

DETAILED DESCRIPTION

A base material of a mold according to the related art tends to expand or contract in accordance with a change in an ambient temperature. In addition, when holding the mold and applying a predetermined tensile force to the mold in order to perform a posture control, the mold is extremely expanded. As a result, in an example of the related art, it was difficult to improve transfer accuracy.

A mold, a configuration of an imprint device, and an imprint method according to an embodiment of the present disclosure will be described.

Imprint Device

Figure 1:
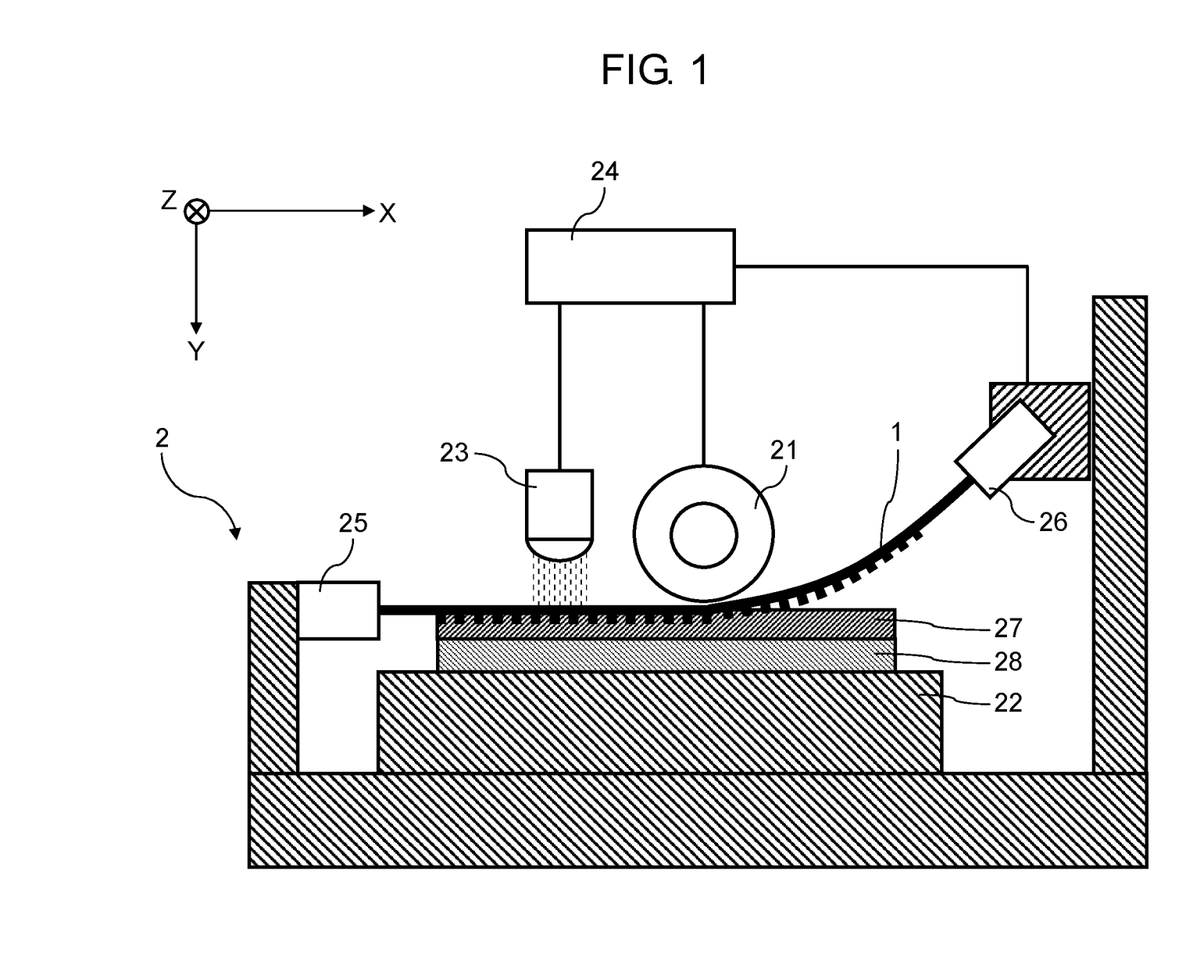
FIG. 1 is a schematic diagram showing a cross-section of an imprint device according to an embodiment.

FIG. 1 shows a schematic sectional diagram illustrating imprint device 2 according to the embodiment. Imprint device 2 includes sheet-shaped mold 1, fixed holder 25, and movable holder 26. In addition, imprint device 2 may also include pressure roll 21, stage 22, UV irradiator 23, and controller 24. Imprint device 2 is an apparatus configured to carry out a roll-pressure type UV imprint method. Fixed holder 25 and movable holder 26 are collectively referred to as a holder.

Pressure roll 21 is cylindrical, and has an axis at the center. Pressure roll 21 is rotatable about the axis. In addition, pressure roll 21 is movable on a plane parallel with an axis direction (axis direction Z). Pressure roll 21 is movable in a direction (pressure direction Y) toward stage 22 and a direction (advance direction X) perpendicular to axis direction Z and pressure direction Y.

Stage 22 includes a disposing region configured to dispose board 28 to which UV curable resin 27 is applied as a medium to be transferred. The disposing region faces a rugged pattern surface side of mold 1. In addition, a board suction hole (not illustrated) is formed in the disposing region.

UV irradiator 23 is capable of performing irradiation with UV light collimated in a direction of stage 22. UV irradiator 23 is provided at a position where the emitted UV light is not blocked by pressure roll 21. For example, UV irradiator 23 irradiates in pressure direction Y of pressure roll 21 with UV light. In this case, when viewed from pressure direction Y, UV irradiator 23 is provided at a position where UV irradiator 23 does not overlap with pressure roll 21. UV irradiator 23 is, for example, a light emitting diode (LED) or a mercury lamp; however, is not limited to the examples.

Mold 1 is sheet-shaped, and is provided between pressure roll 21 and stage 22. Although details will be described later, an end portion of mold 1 is provided with a region where the pattern is not formed. One end of mold 1 is held by fixed holder 25, and the other end of mold 1 is held by movable holder 26. It is possible to adjust the tensile force applied to mold 1 and an angle of mold 1 with respect to stage 22 to be in a predetermined range, by moving pressure roll 21 and movable holder 26.

Controller 24 includes a processor and a memory. The memory stores one or more programs causing the processor to control an operation of each component or whole components of imprint device 2 such as pressure roll 21 and movable holder 26. Controller 24 is also connected with UV irradiator 23, and also stores a program to control turning on and off and light intensity of UV irradiator 23.

Mold

Figure 2:
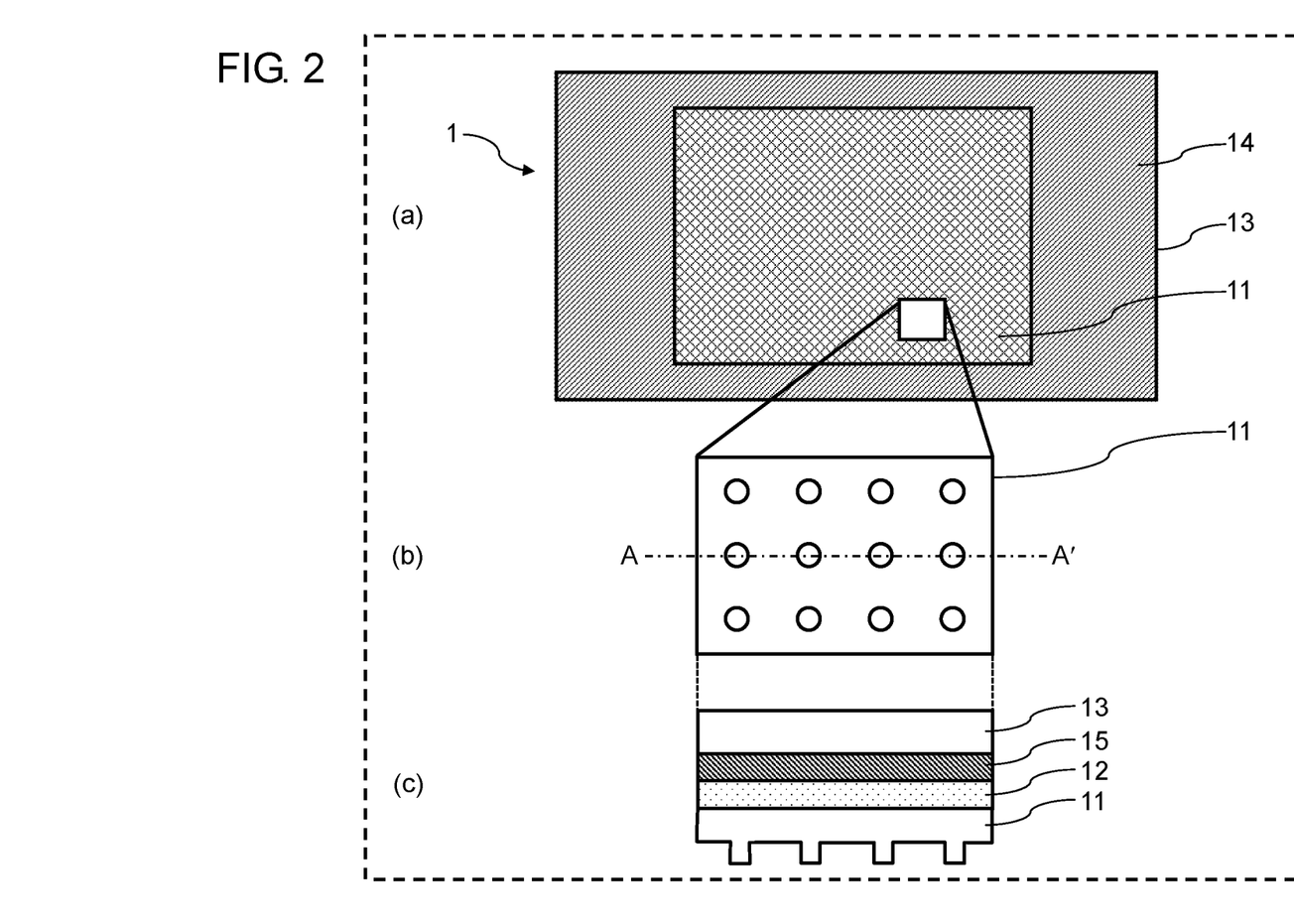
FIG. 2 is an explanatory diagram illustrating a mold according to the embodiment.

A configuration of mold 1 according to the embodiment will be described. FIG. 2 is an explanatory diagram illustrating mold 1. Portion (a) of FIG. 2 shows a top view of mold 1 when viewed from rugged pattern layer 11 side. Portion (b) of FIG. 2 shows an enlarged plan view of a partial region of rugged pattern layer 11 of mold 1. Portion (c) of FIG. 1 shows an enlarged sectional view of portion (b) of FIG. 2 taken along line A-A. Mold 1 includes rugged pattern layer 11 that is formed of resin, inorganic sheet layer 12 that supports rugged pattern layer 11 and is formed of an inorganic material, and elastic sheet layer 13 that supports inorganic sheet layer 12 and is formed of resin. In particular, mold 1 has a lamination structure including inorganic sheet layer 12. Therefore, even in a case where elastic sheet layer 13 expands or contracts, it is possible to suppress an influence on rugged pattern layer 11. In detail, even elastic sheet layer 13 expands or contracts, inorganic sheet layer 12 hardly expands or contracts. Therefore, rugged pattern layer 11 supported by inorganic sheet layer 12 also hardly expands or contracts. Accordingly, it is possible to maintain a rugged pattern with high accuracy. It is possible to perform transference with high accuracy using mold 1. That is, it is possible to apply mold 1 to a field, for which a transfer accuracy in a nanometer order or a micrometer order is required, such as a field of manufacturing a semiconductor.

Next, each layer configuring mold 1 will be described.

Rugged Pattern Layer

Rugged pattern layer 11 is formed of resin. A fine structure having a size of a nanometer order or a micrometer order is formed on a surface of rugged pattern layer 11. The resin for forming rugged pattern layer 11 is transmissive to UV light. As long as the resin is only to have strength to extent that the pattern does not collapse at the time of pressure transfer, there is no particular limitation. The term of "transmissive" specifically refers to a state in which a transmittance of light having a wave length of 10 nm to 400 nm is 60% or higher. The same is also applied to the description below.

Examples of the resin for forming rugged pattern layer 11 include thermoplastic resin, specifically, polyethylene resin, acrylic resin, polycarbonate resin, polyimide resin, polypropylene resin, nylon resin, and the like. In addition, examples of the resin for forming rugged pattern layer 11 include UV curable resin, specifically, urethane acrylate resin, epoxy acrylate resin, polyester acrylate resin, acrylic acrylate resin, and the like.

A release film may be provided on the surface of rugged pattern layer 11. Examples of a material of the release film include a fluorine type releasing agent, a silicon type releasing agent, and the like. The material of the release film may be appropriately selected according to adhesion with the resin for forming rugged pattern layer 11, a thickness of the release film, and the like. Rugged pattern layer 11 is formed in a manner that resin is applied to inorganic sheet layer 12, a rugged pattern formed in a master mold is transferred by pressing the master mold to the resin of inorganic sheet layer 12, the resin is cured, and then the master mold is released from the resin.

Inorganic Sheet Layer

Inorganic sheet layer 12 is formed for an inorganic material that supports rugged pattern layer 11. Inorganic sheet layer 12 is disposed between rugged pattern layer 11 and elastic sheet layer 13, and exhibits a function of preventing rugged pattern layer 11 from being influenced by expansion or contraction of elastic sheet layer 13. Inorganic sheet layer 12 is formed of an inorganic material, and preferably formed of a material that is transmissive to UV light, has high Young's modulus, has flexibility, and has smoothness on a surface of the material.

It is preferable that inorganic sheet layer 12 is formed of an inorganic material that is a material having high Young's modulus. Moreover, when considering UV transmittance and flexibility, it is more desirable that inorganic sheet layer 12 is formed of glass. Examples of glass include aluminosilicate glass, borosilicate glass, soda lime glass, alkali-free glass, quartz glass, and the like. In particular, in consideration of processability, material cost, and the like, it is preferable to use the alkali-free glass.

In addition, it is desirable that an end face of an outer circumference of inorganic sheet layer 12 is smooth. Because, when imprint transferring, since the pattern is sequentially transferred using the pressure roll while deforming mold 1, if the end face is not smooth, mold 1 is likely to crack at a position of the end face as a starting point. As a method for smoothly cutting the end face, it is possible to adopt a scriber or the like. In particular, it is preferable that the end face is cut using a laser scribe method.

In order to improve adhesion with rugged pattern layer 11, primer treatment may be performed on a surface of inorganic sheet layer 12 where rugged pattern layer 11 is formed (an interface between inorganic sheet layer 12 and rugged pattern layer 11) to impart adhesion.

Elastic Sheet Layer

Elastic sheet layer 13 is formed of resin, and supports inorganic sheet layer 12. Elastic sheet layer 13 holds inorganic sheet layer 12 as a base material of mold 1, and rugged pattern layer 11 via inorganic sheet layer 12. Elastic sheet layer 13 is formed of resin that has flexibility and smooth surface, in order to deform actively when carrying out an imprint method. In addition, it is desirable that elastic sheet layer 13 is transmissive to UV light, in order to carry out a UV imprint method.

Examples of the resin for forming elastic sheet layer 13 include PET resin, acrylic resin, polycarbonate resin, polyimide resin, polypropylene resin, nylon resin, and the like. Among the examples, PET resin that is excellent in UV light transmittance, smoothness, and flexibility is appropriate as elastic sheet layer 13.

In addition, elastic sheet layer 13 is formed to have external dimension larger than the external dimension of any of rugged pattern layer 11 and inorganic sheet layer 12. Holding region 14 that is configured to hold mold 1 to imprint device 2 is provided on a part or an entire circumference of elastic sheet layer 13. In this case, elastic sheet layer 13 has holding region 14, that is a region not covered with inorganic sheet layer 12 in a plan view (a top view). That is, in a top view, elastic sheet layer 13 is larger than inorganic sheet layer 12. Holding region 14 is held by the holder (fixed holder 25, movable holder 26) of imprint device 2, thereby being possible to concentrate stress only on elastic sheet layer 13 and suppress the influence on rugged pattern layer 11, when imprinting. On the other hand, when inorganic sheet layer 12 or rugged pattern layer 11 is directly held by imprint device 2 without holding region 14, the stress is concentrated on inorganic sheet layer 12 and inorganic sheet layer 12 is cracked. Accordingly, there is possibility that rugged pattern layer 11 is destroyed. In holding region 14, since elastic sheet layer 13 is exposed not covered with inorganic sheet layer 12, it is possible to relax stress concentration at the exposed region.

Figure 3:
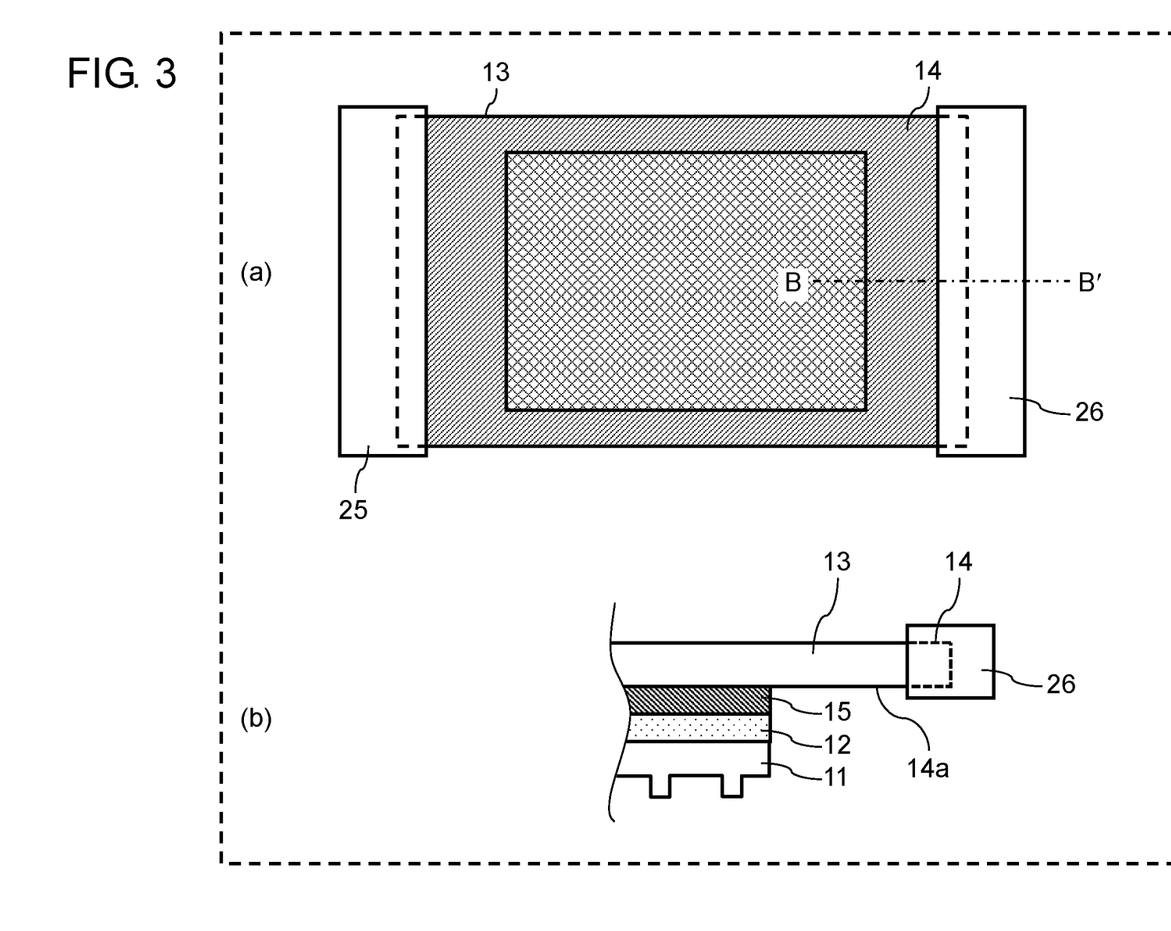
FIG. 3 is a diagram showing a plan view and a cross-section of a main part of the mold held by the imprint device according to the embodiment in a plan view.

FIG. 3 shows a schematic diagram illustrating a case where holding region 14 of elastic sheet layer 13 is held by imprint device 2. Portion (a) of FIG. 3 is a schematic plan view of mold 1. Portion (b) of FIG. 3 is a sectional view of a main part of portion (a) of FIG. 3 taken along line B-B', and is partially enlarged view of a cross-section in a thickness direction. Since the region held by the holder (fixed holder 25, movable holder 26) of imprint device 2 is narrower than entire area of holding region 14, even when disposition is performed to imprint device 2, a portion of holding region 14 is exposed. That is, even in a state where mold 1 is held by imprint device 2, a portion of elastic sheet layer 13 is exposed. In holding region 14 of FIG. 3, a region held by the holder is illustrated by broken line, and a region, that is not held by the holder and is exposed, is illustrated as exposed region 14a. The stress at the time of imprinting is released and the influence on rugged pattern layer 11 is suppressed, by exposed region 14a. Therefore, pattern accuracy of rugged pattern layer 11 is highly maintained.

Regarding a size of holding region 14 and exposed region 14a, the region to be held by the holder is required. Therefore, it is desirable that a size of elastic sheet layer 13 is set so as to be larger than the external dimension of rugged pattern layer 11 by a dimension of equal to or greater than 1 mm and equal to or smaller than 300 mm.

Fixed holder 25 and movable holder 26 are configured to hold both end portions of mold in a right and left direction. However, fixed holder 25 and movable holder 26 may hold the end portions of the mold in an up and down direction and may hold the end portions of the mold in up-down and right-left directions. For example, holding region 14 of mold 1 in up-down and right-left directions may be held by the holder, and may be held applying tensile force. Using the configuration, it can be expected that warpage of mold 1 is further reduced. Here, the right and left direction is, for example, a long-axis direction of elastic sheet layer 13. The up and down direction is a short-axis direction of elastic sheet layer 13.

Adhesion Layer

Elastic sheet layer 13 and inorganic sheet layer 12 may be fixed by adhesion layer 15. That is, adhesion layer 15 may be disposed between elastic sheet layer 13 and inorganic sheet layer 12. Adhesion layer 15 is formed of a material having a UV transmittance. Adhesion layer 15 is only to have adhesive strength to extent not peeled off at the time of peeling out rugged pattern layer 11 after imprint from the medium to be transferred. Adhesion layer 15 is formed of known bonding agent, adhesive, an adhesive sheet, or the like.

Thickness of Each Layer of Mold

It is possible to realize transference with further higher accuracy, by appropriately setting a thickness of each layer of mold 1 as follows.

It is desirable that the thickness of rugged pattern layer 11 is smaller than the thickness of inorganic sheet layer 12. When the thickness of rugged pattern layer 11 is equal to or larger than the thickness of inorganic sheet layer 12, there is possibility that warpage occurs in a thickness direction of rugged pattern layer 11 due to cure contraction of rugged pattern layer 11. In addition, there is possibility of increasing a contraction amount in a plane direction of rugged pattern layer 11 along with the thickness increasing. Therefore, it is difficult to ensure the transfer accuracy at a micro order. Specifically, the diameter of rugged pattern layer 11 is desirably equal to or larger than 0.01 µm and equal to or smaller than 30 µm, and more desirably equal to or larger than 0.01 µm and equal to or smaller than 10 µm.

It is desirable that the thickness of inorganic sheet layer 12 is smaller than the thickness of elastic sheet layer 13. Since the thickness of inorganic sheet layer 12 is formed to have a smaller thickness, the flexibility is improved. Therefore, even when a slight bending stress is applied to elastic sheet layer 13, crack hardly occurs in inorganic sheet layer 12.

Specifically, the thickness of inorganic sheet layer 12 may be equal to or larger than 30 µm and equal to or smaller than 500 µm, and is more preferably equal to or larger than 30 µm and equal to or smaller than 100 µm. When the thickness of inorganic sheet layer 12 is smaller than 30 µm, the flexibility improves, but the handling property becomes very poor.

It is desirable that elastic sheet layer 13 has the largest thickness among the layers for forming mold 1.

Specifically, the thickness of elastic sheet layer 13 is equal to or larger than 50 µm and equal to or smaller than 1000 µm, and is more preferably equal to or larger than 100 µm and equal to or smaller than 500 µm. When the thickness of elastic sheet layer 13 is larger than 1000 µm, the flexibility is lowered or the UV transmittance is remarkably reduced. Therefore, there is possibility that cure reaction of the medium to be transferred is not accelerated.

It is desirable that the thickness of adhesion layer 15 is smaller than the thickness of inorganic sheet layer 12 and larger than rugged pattern layer 11. Specifically, the thickness of adhesion layer 15 is desirably equal to or larger than 1 µm and equal to or smaller than 100 µm and more desirably equal to or larger than 10 µm and equal to or smaller than 50 µm. When the thickness of the adhesion layer 15 is set to be equal to or larger than 10 µm, the adhesive strength can be secured. When the thickness of the adhesion layer 15 of above described is set to be equal to or smaller than 50 µm, it is possible to prevent the UV transmittance from lowering.

From the above, a relationship of the thickness of each layer for forming mold 1 is summarized as follows. The thickness of elastic sheet layer 13 is larger than the thickness of inorganic sheet layer 12. The thickness of inorganic sheet layer 12 is larger than the thickness of rugged pattern layer 11. In addition, the thickness of inorganic sheet layer 12 is larger than the thickness of adhesion layer 15, and the thickness of adhesion layer 15 is larger than the thickness of rugged pattern layer 11. The thickness of each layer is set to satisfy the relation, and within the specific dimension range. Accordingly, mold 1 has a high flexibility and it is possible to realize transfer of a pattern with high accuracy. The thicknesses of layers are substantially uniform in the plane, and the thickness of each layer shows the maximum thickness. The thickness of rugged pattern layer 11 refers to a distance from the interface between rugged pattern layer 11 and inorganic sheet layer 12 to a tip end of the projection portion of the rugged pattern.

Young's Modulus of Each Layer of Mold

It is possible to realize transfer with higher accuracy, by setting Young's modulus of each layer of mold 1 to satisfy conditions to be described. That is, the Young's modulus of inorganic sheet layer 12 is higher than the Young's modulus of elastic sheet layer 13. The Young's modulus of elastic sheet layer 13 is higher than the Young's modulus of adhesion layer 15.

Specifically, in order to provide appropriate flexibility on the whole of mold 1, it is desirable that the Young's modulus of elastic sheet layer 13 is equal to or higher than 1 GPa and equal to or lower than 10 GPa.

In addition, the Young's modulus of inorganic sheet layer 12 is equal to or higher than 10 GPa and equal to or lower than 600 GPa, more desirably equal to or higher than 50 GPa and equal to or lower than 500 GPa. By setting the Young's modulus as above, in a case where a predetermined tensile force is applied to elastic sheet layer 13, it is possible to prevent rugged pattern layer 11 from stretching at inorganic sheet layer 12. It is possible to prevent rugged pattern layer 11 from stretching in a plane direction by inorganic sheet layer 12 having the above Young's modulus. Therefore, it is possible to transfer the pattern with good accuracy.

The Young's modulus of adhesion layer 15 is desirably higher than 0 Pa and equal to or lower than 1 GPa, and more desirably equal to or lower than 0.1 GPa. It is possible to reduce the warpage, by setting the Young's modulus of adhesion layer 15 to be lower than the Young's modulus of elastic sheet layer 13. Since the stress applied to elastic sheet layer 13 is absorbed by adhesion layer 15, the stress applied to inorganic sheet layer 12 can be relaxed.

Imprint Method

Figure 4:
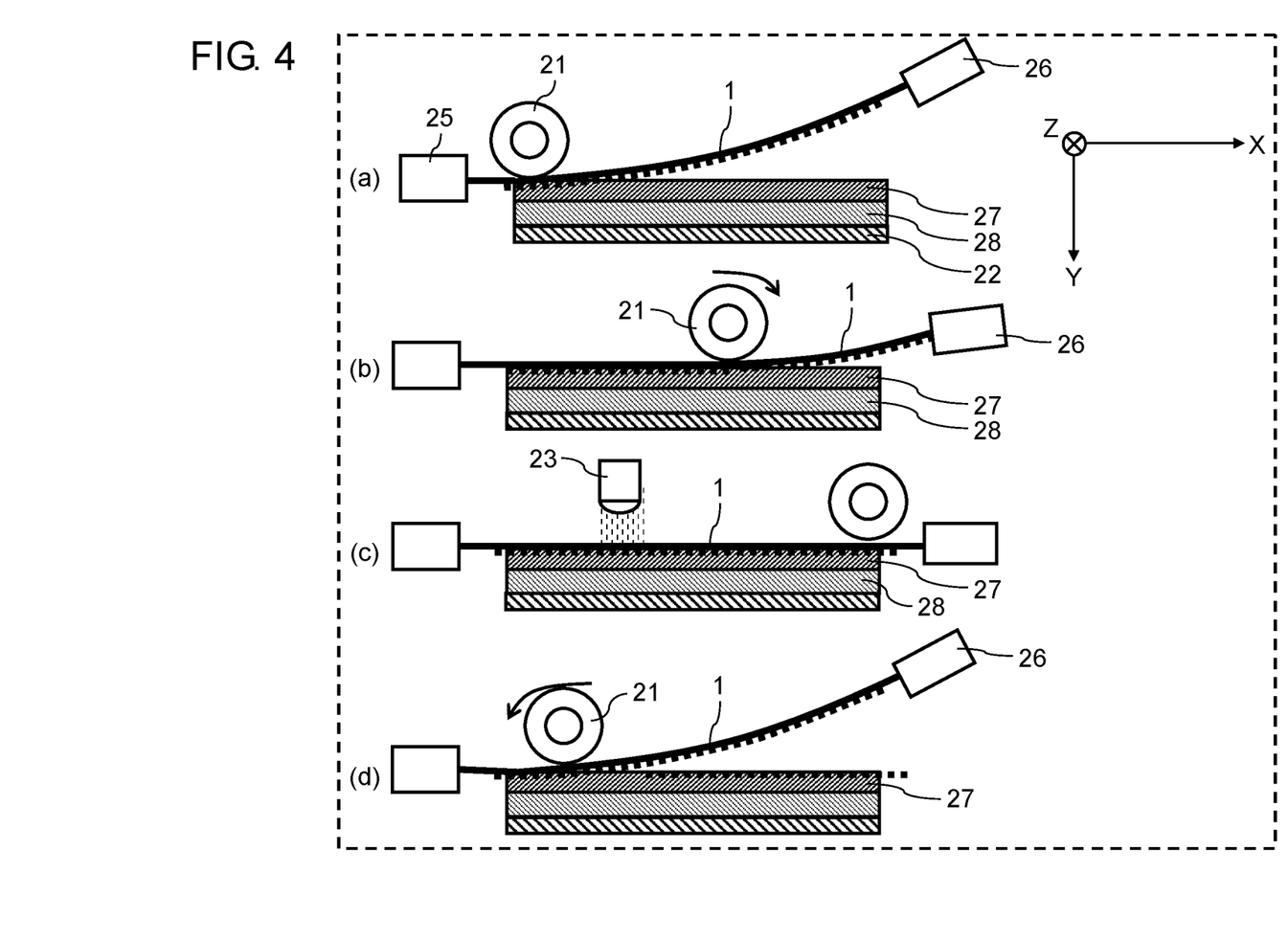
FIG. 4 is a cross-sectional diagram illustrating a process of imprint operations of the imprint device according to the embodiment.

Next, the imprint method using mold 1 and imprint device 2 will be described using FIG. 4. Portion (a) to portion (d) of FIG. 4 shows a cross-sectional diagram illustrating a process of imprint operations of the imprint device 2 according to the embodiment. The imprint method includes preparing a board to which resin is applied and transferring a pattern to the resin using mold 1.

The Imprint Method will be Described Below.

First, board 28 to which uncured UV curable resin 27 is applied is prepared on stage 22, as shown in portion (a) of FIG. 4. A relative position between mold 1 and board 28 is adjusted such that the UV curable resin 27 faces rugged pattern forming surface of mold 1. One end side of board 28 comes into contact with one end of mold 1 to press the contacted point with pressure roll 21. The position adjustment is carried out by lowering fixed holder 25 (move toward approaching direction) and raising movable holder 26 (move toward separating direction). At this time, since the other end side of mold 1 is separated from board 28, mold 1 is deformed in a smooth and curved surface shape. In addition, board 28 is aligned with a predetermined position, is sucked and held on the disposing region of stage 22 by board suction hole. Next, pressure roll 21 is caused to move in pressure direction Y that is a thickness direction of mold 1, while controlling the tensile force and angle to be in a predetermined range by the holders that hold both ends of mold 1. By moving pressure roll 21 in pressure direction Y, a pressure perpendicular to board 28 is applied. At this time, a magnitude of the pressure is measured by a load cell (not illustrated). When the measured pressure reaches a predetermined pressure, the process proceeds to next process.

In next process, as shown in portion (b) of FIG. 4, when the predetermined pressure is applied to board 28, pressure roll 21 is caused to move toward an advance direction X (a plane direction of mold 1). Accordingly, mold 1 having flexibility is deformed along with movement of pressure roll 21. At this time, by moving pressure roll 21 in advance direction X, pressure roll 21 rotates around an own axis due to influence of the frictional force with the mold 1. The rugged pattern surface of mold 1 sequentially comes into contact with UV curable resin 27 on board 28, and the rugged pattern is sequentially transferred to UV curable resin 27. As pressure roll 21 moves, movable holder 26 is gradually lowered (approaches board 28), thereby realizing smooth transfer.

Then, as shown in portion (c) of FIG. 4, UV irradiator 23 irradiates UV curable resin 27 with UV light to cure UV curable resin 27. Since mold 1 is a material having UV transmittance, it is possible to irradiate UV curable resin 27 with UV light by irradiating toward board 28 via mold 1 with UV light. A method of irradiating a target with UV light via mold 1 is effective in a case where board 28 does not have UV transmittance.

Finally, as shown portion (d) of FIG. 4, mold 1 is released from UV curable resin 27. Specifically, pressure roll 21 is caused to move toward a direction opposite to advance direction X, and movable holder 26 is raised (is separated from board 28), thereby enabling peeling off of mold 1 from UV curable resin 27 using the tensile force of mold 1.

The imprint method is possible to realize uniform transfer with good accuracy, by above processes.

The imprint method is optimized to be carried out as a UV imprint method. However, the imprint method may be carried out using a heat imprint method by using mold 1 and imprint device 2.

Any configurations among the various configurations described above may be appropriately combined, thereby exhibiting effects of the configurations.

According to an aspect of the present disclosure, even when tensile force to the mold is changed or an ambient temperature is changed, it is possible to reduce a change in a diameter of the pattern. It becomes possible to perform the transfer with high accuracy.

The present disclosure is useful an imprint field, for which a transfer position accuracy in a nanometer order or a micrometer order is required.

What is claimed is:

1. A mold comprising:
   a rugged pattern layer including a first surface and a second surface that are opposite to each other, the first surface having a rugged pattern;
   an inorganic sheet layer that is formed of an inorganic material and supports the rugged pattern layer; and
   an elastic sheet layer that supports the inorganic sheet layer,
   wherein the inorganic sheet layer is between the rugged pattern layer and the elastic sheet layer,
   wherein the second surface is between the first surface and the inorganic sheet,
   wherein the elastic sheet layer is larger than the inorganic sheet layer in top view, and
   wherein the elastic sheet layer has a region that is not covered with the inorganic sheet layer.

2. The mold of claim 1,
   wherein the rugged pattern layer is formed of resin,
   wherein the elastic sheet layer is formed of resin, and
   wherein the inorganic sheet layer is formed of glass.

3. The mold of claim 1,
wherein a thickness of the elastic sheet layer is larger than a thickness of the inorganic sheet layer, and
wherein the thickness of the inorganic sheet layer is larger than a thickness of the rugged pattern layer.

4. The mold of claim 3,
wherein the thickness of the elastic sheet layer is equal to or larger than 50 µm and equal to or smaller than 1000 µm,
wherein the thickness of the inorganic sheet layer is equal to or larger than 30 µm and equal to or smaller than 100 µm, and
wherein the thickness of the rugged pattern layer is equal to or larger than 0.01 µm and equal to or smaller than 30 µm.

5. The mold of claim 3, further comprising:
an adhesion layer disposed between the inorganic sheet layer and the elastic sheet layer.

6. The mold of claim 5,
wherein the thickness of the inorganic sheet layer is larger than a thickness of the adhesion layer, and
wherein the thickness of the adhesion layer is larger than the thickness of the rugged pattern layer.

7. The mold of claim 5,
wherein a Young's modulus of the inorganic sheet layer is higher than a Young's modulus of the elastic sheet layer, and
wherein the Young's modulus of the elastic sheet layer is higher than a Young's modulus of the adhesion layer.

8. The mold of claim 7,
wherein the Young's modulus of the inorganic sheet layer is equal to or higher than 10 GPa and equal to or lower than 600 GPa,
wherein the Young's modulus of the elastic sheet layer is equal to or higher than 1 GPa and equal to or lower than 10 GPa, and
wherein the Young's modulus of the adhesion layer is higher than 0 Pa and equal to or lower than 1 GPa.

9. The mold of claim 1, wherein the rugged pattern layer, the inorganic sheet layer, and the elastic sheet layer transmit UV light.

10. An imprint device comprising:
the mold of claim 1; and
a holder that holds the region of the elastic sheet layer that is not covered with the inorganic sheet layer.

11. An imprint method comprising:
preparing a board to which a resin is applied; and
transferring a pattern to the resin using the mold of claim 1.

12. The mold of claim 1, wherein the second surface of the rugged pattern layer is in direct contact with the inorganic sheet layer.

13. An imprint device comprising:
the mold of claim 1;
a fixed holder; and
a movable holder,
wherein the region of the elastic sheet layer that is not covered with the inorganic sheet layer has a first region and a second region,
wherein the elastic sheet layer has a covered region that is covered with the inorganic sheet layer, the covered region being between the first region and the second region,
wherein the fixed holder holds the first region, and
wherein the movable holder holds the second region.

14. The imprint device of claim 13, wherein the movable holder is configured to move relative to the fixed holder.

15. The imprint device of claim 14, further comprising a stage, wherein the fixed holder is fixed to the stage.

16. The imprint device of claim 15, further comprising a UV irradiator configured to irradiate ultraviolet light to the stage through the mold.

17. The imprint device of claim 15, wherein the elastic sheet layer is flexible to allow the mold to move with the movable holder.

* * * * *